(12) United States Patent
Shoji et al.

(10) Patent No.: US 6,270,712 B1
(45) Date of Patent: Aug. 7, 2001

(54) MOLDING DIE AND MARKING METHOD FOR SEMICONDUCTOR DEVICES

(75) Inventors: Hiroyuki Shoji; Kazuo Kusuda; Tsuneo Matsumura, all of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/248,142

(22) Filed: Feb. 9, 1999

(30) Foreign Application Priority Data

Feb. 9, 1998 (JP) .................................................. 10-027135

(51) Int. Cl.⁷ ............................. B29C 45/02; B29C 45/26
(52) U.S. Cl. ................. 264/272.17; 249/103; 249/114.1; 264/132; 425/116; 425/117; 425/192 R
(58) Field of Search ............................... 264/272.17, 132; 425/116, 117, 183, 192 R; 249/114.1

(56) References Cited

U.S. PATENT DOCUMENTS

| | | | | |
|---|---|---|---|---|
| 3,534,440 | * | 10/1970 | Roberts ................................. | 249/103 |
| 4,519,972 | * | 5/1985 | Stevenson ............................ | 249/103 |
| 4,944,908 | * | 7/1990 | Leveque et al. ..................... | 264/132 |
| 5,388,803 | * | 2/1995 | Baumgartner et al. ............ | 249/114.1 |
| 5,817,208 | * | 10/1998 | Nose et al. ............................ | 156/500 |

FOREIGN PATENT DOCUMENTS

| | | |
|---|---|---|
| 0 756 925 A1 | 2/1997 | (EP) . |
| 57-060857 | 4/1982 | (JP) . |
| 58-23457 | 2/1983 | (JP) . |
| 59-028350 | 2/1984 | (JP) . |
| 60-119760 | 6/1985 | (JP) . |
| 62-020353 | 1/1987 | (JP) . |
| 62-238616 | 10/1987 | (JP) . |
| 1-128450 | 5/1989 | (JP) . |
| 2-205042 | * 8/1990 | (JP) .................................. 264/272.17 |
| 4-022142 | 1/1992 | (JP) . |
| 4-171833 | 6/1992 | (JP) . |
| 6-120281 | 4/1994 | (JP) . |

OTHER PUBLICATIONS

"Foil Covered PACkage (FPAC): A New Package concept", Y. Hotta, et al. Proceedings of the Electriconic Components and Technology Conference, US, New York, IEEE, vol. Conf. 46, pp. 1258–1264, May 28, 1996.

* cited by examiner

*Primary Examiner*—Robert Davis
(74) *Attorney, Agent, or Firm*—Dike Bronstein Roberts & Cushman IP Group; David G. Conlin; David A. Tucker

(57) ABSTRACT

An object of the invention is to eliminate a marking process and shorten the time and decrease the cost required for changing contents of marking. An uneven mask is mounted, using a mask set jig, on a mark surface die of the molding die for forming a resin mold package of a semiconductor device. The mark surface die is formed with jig-fixing grooves for mounting the mask set jig. The uneven mask is formed with protrusions and recesses corresponding to the contents of marking to be attached to the surface of the resin mold package. The contents of marking can thus be attached simultaneously with the molding process, and therefore the marking process after molding can be omitted. In accordance with the contents of marking, the uneven mask can be replaced. The time and cost required for changing the contents of marking can thus be reduced.

17 Claims, 9 Drawing Sheets

MOLDING DIE AND MARKING METHOD FOR SEMICONDUCTOR DEVICES

BACKGROUND OF THE INVENTION

1. Field of the Invention

The present invention relates to a molding die and marking method for fabricating a resin mold package with a marked surface for semiconductor device.

2. Description of the Related Art

Conventionally, a light-coupled element as shown in FIG. 13 has been widely used as a kind of semiconductor element sealed in a resin mold package. Before assembling the light-coupled element as shown in FIG. 13, a light-emitting element 3 and a photo-detector 4 are coupled by a die bond to lead frames 1, 2, respectively. Further, the lead frames 1, 2 are wire-bonded to the light-emitting element 3 and the photo-detector 4, respectively, using bonding wires 5 of gold or the like, and a precoat resin 6 of silicon resin or the like is coated around the light-emitting element 3. After that, the lead frames 1, 2 are spot welded or set in a loading frame so that the light-emitting element 3 and the photo-detector 4 are placed in opposed relation to each other and held in such relative positions as to be coupled optically. Under this condition, the assembly is sealed with a primary mold resin 7 of light-transmitting epoxy resin or the like. Further, the resulting assembly is sealed with a secondary mold resin 8 of a light-shielding epoxy resin or the like.

The transfer molding is used for sealing with the primary mold resin 7 and the secondary mold resin 8. After molding, the portions of the lead frames 1, 2 exposed to the outside of the mold resin are subjected to a post-treatment such as exterior plating or forming. Further, the electrical characteristics of the assembly are checked as a light-coupled element, and marking a surface of the resin mold package with a mark is carried out.

FIG. 14 shows the steps of fabricating the light-coupled element shown in FIG. 13. Steps a1 to a3 represent the pretreatment of the light-emitting element 3, and steps b1 and b2 the pretreatment of the photo-detector 4. Steps c1 to c7 represent the process for fabricating the light-coupled element.

In steps a1 and b1, the light-emitting element 3 and the photo-detector 4 are die-bonded at predetermined positions of the lead frames 1, 2, respectively. The "light-emitting element" and the "photo-detector", which constitute an infrared "light-emitting diode" and a "photo transistor", respectively, for example, which will hereinafter sometimes be abbreviated as "LED" and "PT", respectively. In steps a2 and b2, predetermined portions of the lead frames 1, 2 are wire-bonded with bonding pads formed on the light-emitting element 3 and the photo-detector 4, respectively. The light-emitting element 3 is further precoated with the precoat resin 6 in step a3.

In step c1, the lead frame 1 on which the light-emitting element 3 is mounted and the lead frame 2 on which the photo-detector 4 is mounted are set in a molding die in such a manner that the light-emitting element 3 and the photo-detector 4 are optically coupled to each other, and the primary molding is performed using a primary molding die. In step c2, the secondary molding is performed by setting the mold of the primary mold resin 7 and sealing the mold with the secondary mold resin 8. Upon completion of the secondary molding, the portions of the lead frames 1, 2 exposed to the outside of the resin mold package are exterior-plated or formed by bending, followed by step c3 in which the electrical characteristics are checked. In the case where the assembly is determined as conforming as a result of the characteristics check, marking the surface of the resin mold package with the mark 9 is carried out in step c4. Then, in step c5, the appearance inspection is conducted on the parts including the mark. A conforming product is packaged in step c6, and shipped to the market or customers in step c7.

Light-coupled elements include a photo-coupler and a photo-thyristor. The feature of the light-coupled elements is that they are molded with the primary mold resin 7 such as a light-transmitting epoxy resin or the like in the primary molding process of step c1 of FIG. 14 and then molded with the secondary mold resin 8 such as a light-shielding epoxy resin. The resin mold package for sealing individual semiconductor elements, such as transistors or diodes, or the resin mold package for sealing a semiconductor integrated circuit requires no light-transmitting primary mold resin, and therefore the transfer molding is carried out only once. The process of step c3 and subsequent steps in FIG. 14, however, is basically the same.

A conventional method in which a molding die for semiconductor devices has a marking section so that the marking and molding are carried out at the same time is disclosed in Japanese Unexamined Patent Publication JP-A-6-120281(1994). In the marking section according to this prior art, forward ends of pin-shaped members are protruded from or recessed into the surface of the molding die thereby to form protrusions and recesses corresponding to the markings over the entire surface.

In the conventional process for fabricating semiconductor elements such as light-coupled elements, marking the surface of the package with a mark indicating a product name, a date of fabrication, a trade mark, etc. is carried out by stamping or radiation of laser beam in a separate marking step after molding. This additionally-required step deteriorates the fabrication efficiency and increases the management cost. Also, the mark is often erased or fouled by the dust on the package surface, displaced due to the positioning inaccuracy of the mold, or other inconveniences occur. The resulting lower yield and the increased need of labor for repair work cause a higher cost.

Once protrusions and recesses corresponding to contents of marking are formed directly on the molding die, the molding and marking can be carried out at the same time, thereby avoiding the inconveniences and the increased cost described above. For a semiconductor device including a light-coupled element, however, the same molding die may be used for a plurality of product lines or for the same product line with different markings indicating the date of fabrication and the production lots, in which case changes are needed in the contents of marking. In the case where protrusions and recesses corresponding to the contents of marking are formed directly on the molding die, the die must be replaced each time the contents of marking are changed, thereby leading to a deterioration of the operating efficiency and an increased cost.

A conventional method for forming protrusions and recesses directly on the molding die is proposed in Japanese Unexamined Patent Publication JP-A-6-120281(1994), in which protrusions and recesses are formed by a multiplicity of pin-shaped members protruded and recessed differently. Nevertheless, the die structure is so complicated that the die cost increases, resulting in an increased cost of the final product.

SUMMARY OF THE INVENTION

An object of the invention is to provide a molding die and marking method for semiconductor devices in which marking is carried out without necessitating a marking process after molding, and contents of marking can be changed within a short time.

The invention provides a molding die for molding a resin mold package of a semiconductor device by sealing a semiconductor element in a synthetic resin, comprising:

a molding die having a cavity for accommodating the semiconductor element and filling the synthetic resin;

a mask which is removably mounted on a portion of the molding die adapted to mold a surf ace of the resin mold package to be marked, for marking the surface of the resin mold package; and a jig for holding the mask at a predetermined position in the molding die.

According to the invention, a mask for marking is mounted on a portion of the cavity of the molding die adapted to accommodate the semiconductor element and to be filled with a synthetic resin in which portion the surface of the portion of the resin mold package to be marked is formed. The mask is held by a jig at a predetermined position in the molding die, and marks can be added at the same time that the resin mold package of the semiconductor device is molded by sealing the semiconductor element in the synthetic resin. As a result, the marking process after molding is eliminated. In addition, the mask is removable and therefore the work of changing the contents of marking can be performed within a shorter time for a reduced cost. The jig for holding the mask at a predetermined position in the molding die can still be used after the contents of marking are changed with the mask. Thus the portions to be changed are minimized to shorten the time required for change and decrease the cost.

In the invention it is preferable that the mask has protrusions and recesses formed thereon, indicative of contents to be indicated by the marking.

According to the invention, the contents of marking can be indicated by protrusions and recesses on the surface of a molded resin mold package in accordance with the protrusions and recesses formed on the mask.

Further, the invention provides a marking method for semiconductor devices comprising the step of:

arranging a marking mask in a molding die in forming a resin mold package of the semiconductor device by sealing a semiconductor element in a synthetic resin, thereby marking a surface of the resin mold package to be molded in accordance with contents of marking held by the mask.

According to the invention, the marking mask is arranged in the molding die, and when molding a resin mold package of a semiconductor device by sealing a semiconductor element in a synthetic resin, the surface of the package can be marked at the same time. The contents of marking can be changed by changing the mask. Thus the time required for the-change is shortened and the productivity improved.

Further, in the invention it is preferable that contents of marking are represented by protrusions and recesses.

According to the invention, the protrusions and recesses are formed on the mask, and therefore protrusions and recesses corresponding to those of the mask are formed on the surface of the resin mold package. Therefore, marking with protrusions and recesses can be carried out simultaneously with molding a package.

Further, in the invention it is preferable that the mask is formed of a photosensitive resin.

According to the invention, since the mask is formed of a photosensitive resin, the photosensitive resin yet to be cured is mounted on the molding die and partly cured optically to represent the contents of marking. Then, the portion not cured is solved away with a solvent or the like. Thus, protrusions and recesses corresponding to the contents of marking can be formed.

Further, in the invention it is preferable that the mask is a sheet for transferring the contents of marking to the surface of the resin mold package.

According to the invention, the contents of marking formed and held on the surface of a sheet used as a mask is transferred to the surface of the resin mold package to be molded.

Further, in the invention it is preferable that after the surface of the resin mold package is marked by the mask, the marked surface is stamped with ink for improving the visibility of the contents of marking.

According to the invention, after marking is carried out simultaneously with molding of the resin mold package, the visibility of the marking can be improved by stamping the marked surface with the ink. The stamping with the ink can be executed more easily than the step of marking the package surface. Therefore, the visibility can be improved with a simple work.

Further, the invention provides a marking method for semiconductor devices comprising the steps of:

before molding a resin mold package of a semiconductor device by sealing a semiconductor element in a synthetic resin, stamping contents of marking on a portion of a molding die, the portion being adapted to mold a surface of the resin mold package which surface is to be marked; and coupling the stamped contents of marking with the surface of the resin mold package of the semiconductor device when the resin mold package is molded.

According to the invention, the contents of marking are stamped on the surface of the molding die beforehand, and are coupled to the surface of the resin mold package at the time of molding. Therefore, the contents of marking can be easily changed simply by changing the mask for stamping.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
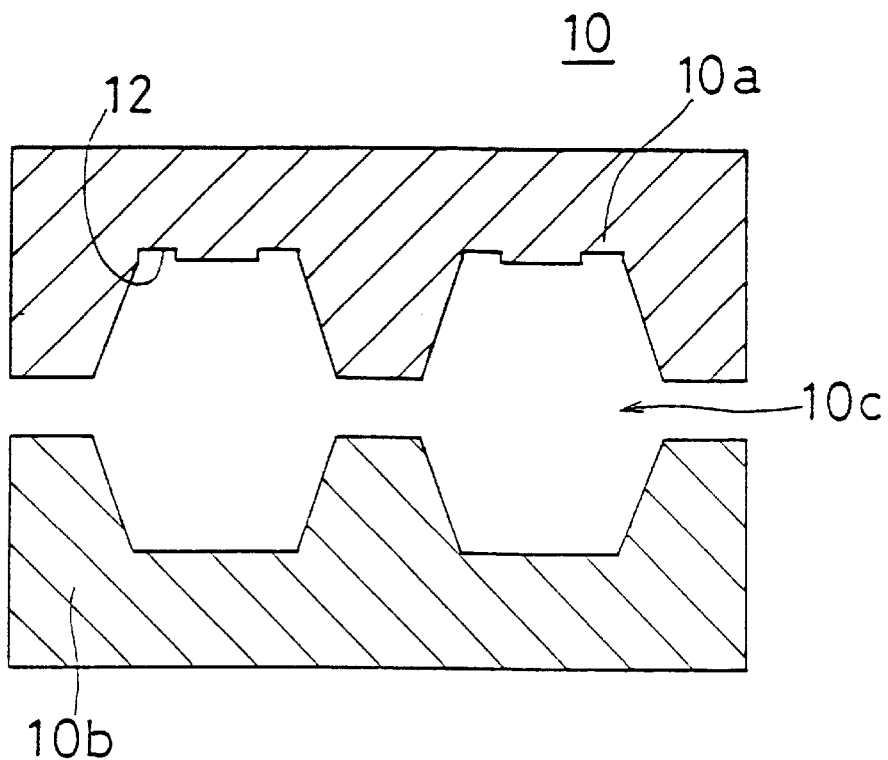
FIG. 1 is a sectional view showing in simplified fashion a configuration of a molding die 10 according to a first embodiment of the invention.

Now referring to the drawings, preferred embodiments of the invention are described below.

Figure 2:
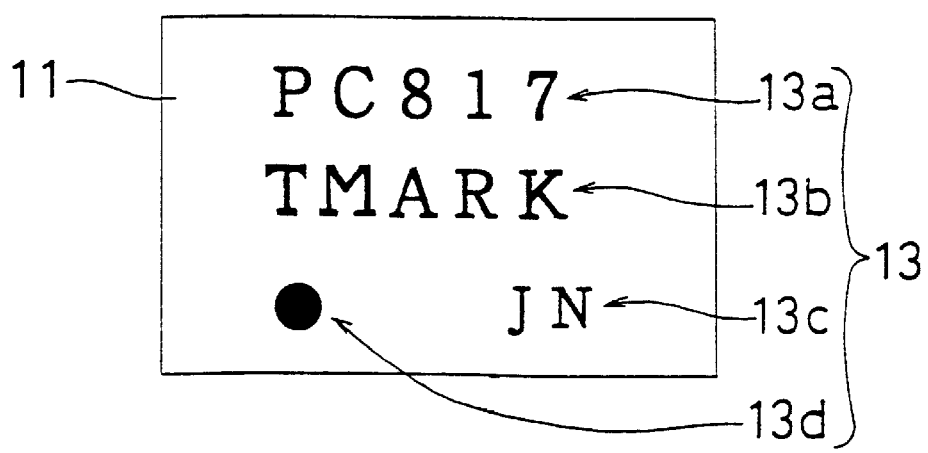
FIG. 2 is a plan view of an uneven mask 11 mounted in the molding die 10 of FIG. 1.

FIG. 1 schematically shows a configuration of a molding die 10 used in the first embodiment of the invention. The molding die 10 includes a mark surface die 10a and a back die 10b with a cavity 10c formed between them. An uneven mask 11 shown in FIG. 2 is mounted removably on the mark surface die 10a. Jig-fixing grooves 12 are formed for mounting the uneven mask 11 on the mark surface die 10a. Generally, a-plurality of cavities 10c are formed and therefore a plurality of packages are obtained by a single molding process.

As shown in FIG. 2, the uneven mask 11 is formed with recesses or protrusions corresponding to contents of marking 13. The contents of marking 13 include, for example, an item name 13a, a trade mark 13b, the fabrication date code 13c and a first lead indication 13d.

Figure 3:
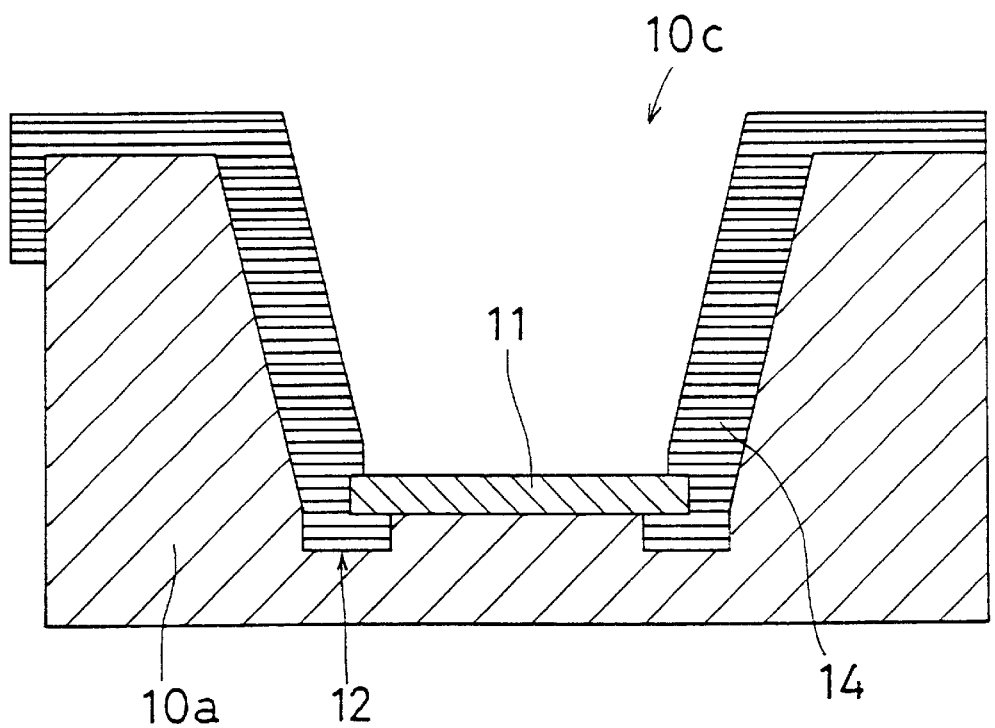
FIG. 3 is a sectional view showing in simplified fashion the state in which the uneven mask 11 is mounted on a mark surface die 10a of the molding die 10 of FIG. 1.

FIG. 3 shows the uneven mask 11 of FIG. 2 mounted on the mark surface die 10a using a mask set Jig 14. The molding die 10 and the mask set Jig 14 are used for a multiplicity of molding processes over a long period of time and therefore are made of durable metal material such as iron. The uneven mask 11, on the other hand, is used for a comparatively few number of molding processes for a short period of time, and therefore can be formed of a synthetic resin or other comparatively soft material on which protrusions and recesses are easily formed which correspond the contents off marking.

Figure 4:
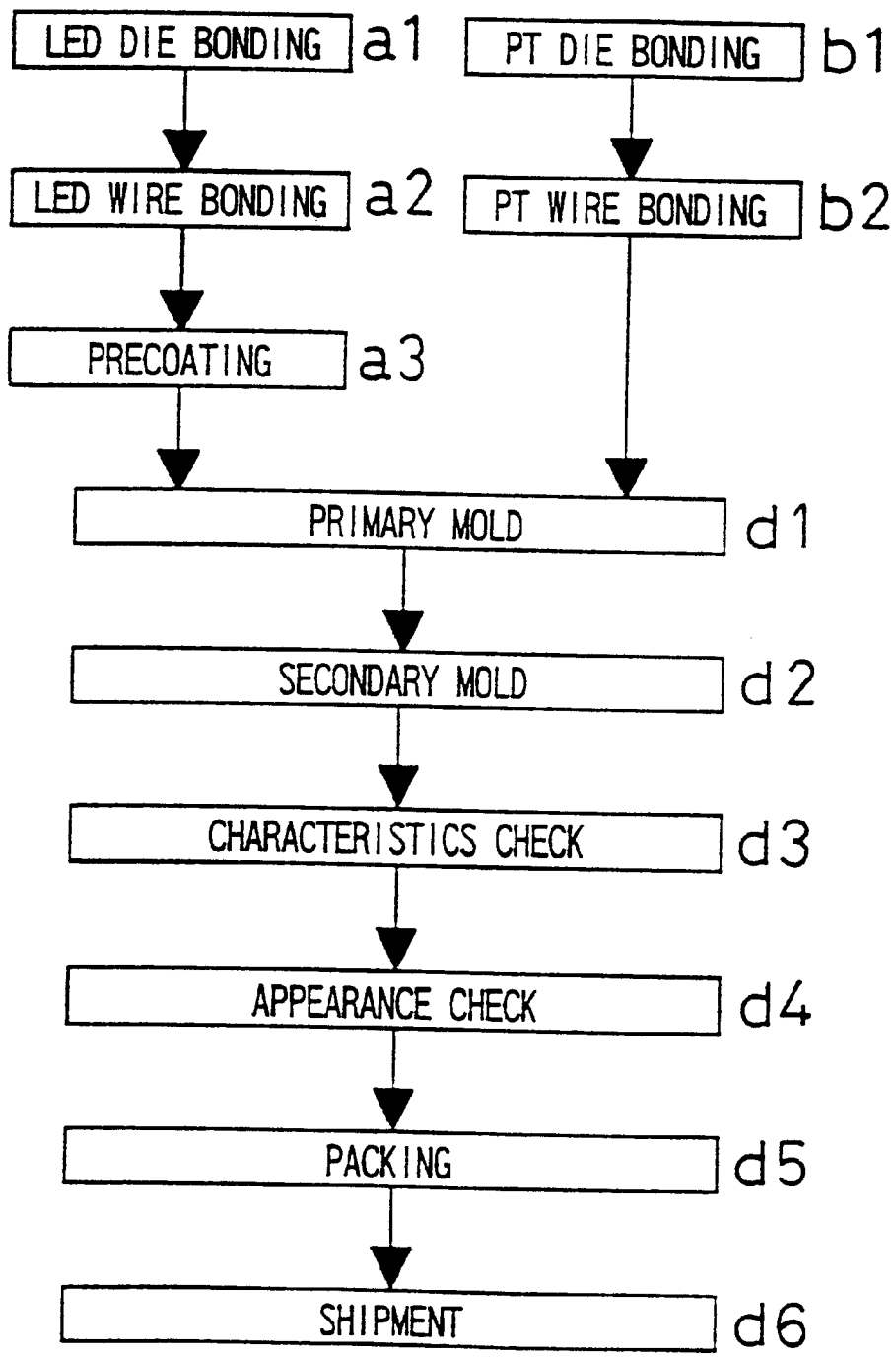
FIG. 4 is a flowchart showing the steps of fabricating a light-coupled element using the molding die 10 of FIG. 1.
Figure 14:
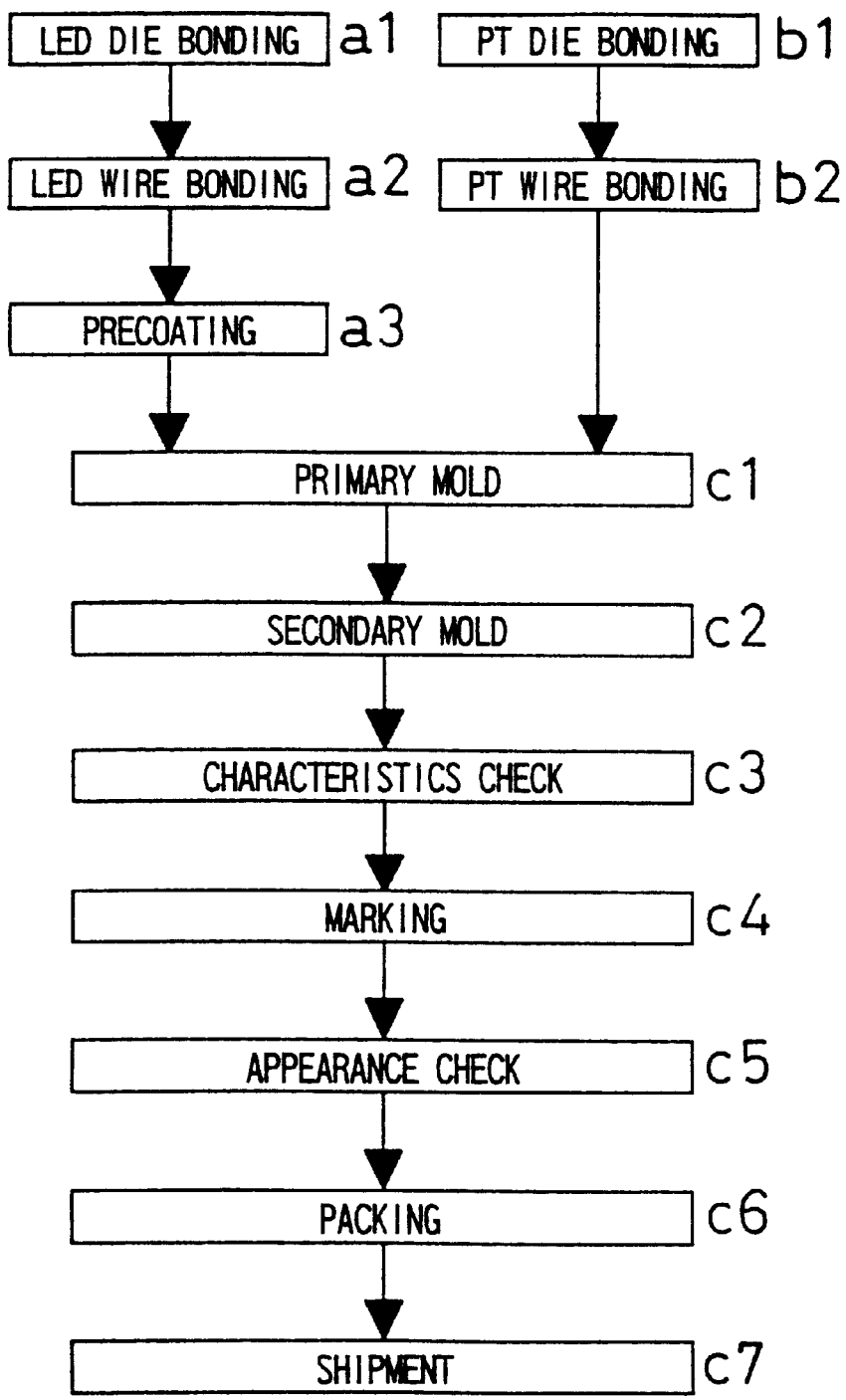
FIG. 14 is a flowchart showing the process of fabricating the light-coupled element of FIG. 13.

FIG. 4 shows the steps of fabricating a light-coupled element according to this embodiment. The process of steps a1 to a3 and steps b1 to b2 is similar to the conventional fabrication process shown in FIG. 14. Step d1 is also similar to step c1 of FIG. 14. In step d2, the marking is carried out at the same time as the secondary molding. The characteristics inspection in step d3, the appearance inspection in step d4, the packing in step d5 and the shipment in step d6 are similar to the characteristics inspection in step c3, the appearance inspection in step c5, the packing in step c6 and the shipment in step c7 shown in FIG. 14, respectively, and will not be described again. The secondary molding in step d2 is carried out with the uneven mask 11 mounted with the mask set jig 14 on the mark surface die 10a. As a result, the secondary molding of the light-coupled element and marking of the surface thereof with the contents of marking can be carried out at the same time. Thus, the appearance inspection in step d4 can be carried out immediately after the characteristic inspection in step d3, and the marking process can be done without.

Figure 5A:
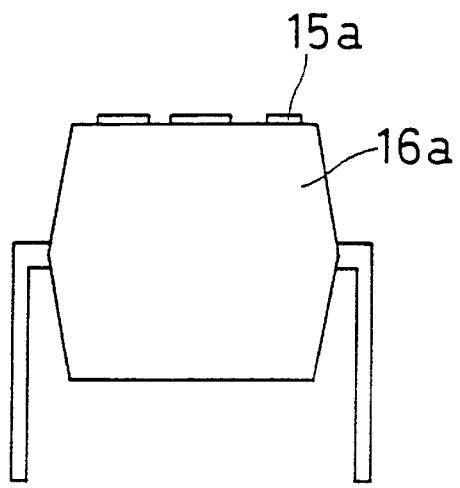
FIGS. 5A and 5B are sectional views showing in simplified fashion light-coupled elements 16a, 16b formed using the molding die 10 of FIG. 1.
Figure 5B:
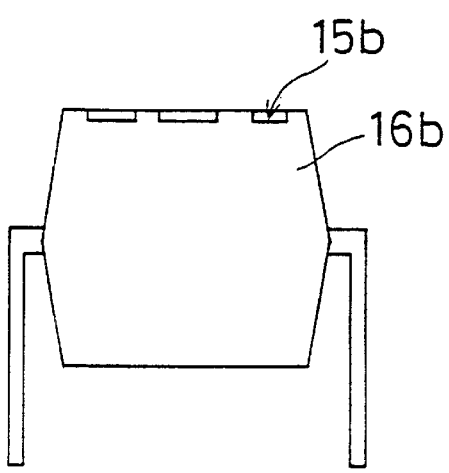

FIGS. 5A and 5B show a state of marking of the light-coupled element as formed by the uneven mask 11 of FIG. 2. FIG. 5A shows a light-coupled element 16a on which protruded marks 15a are added by recesses corresponding to the contents of marking 13 formed on the uneven mask 11 of FIG. 2. FIG. 5B shows a light-coupled element 16b on which recessed marks 15b is formed by protrusions corresponding to the contents of marking 13 formed on the uneven mask 11 of FIG. 2.

Figure 6:
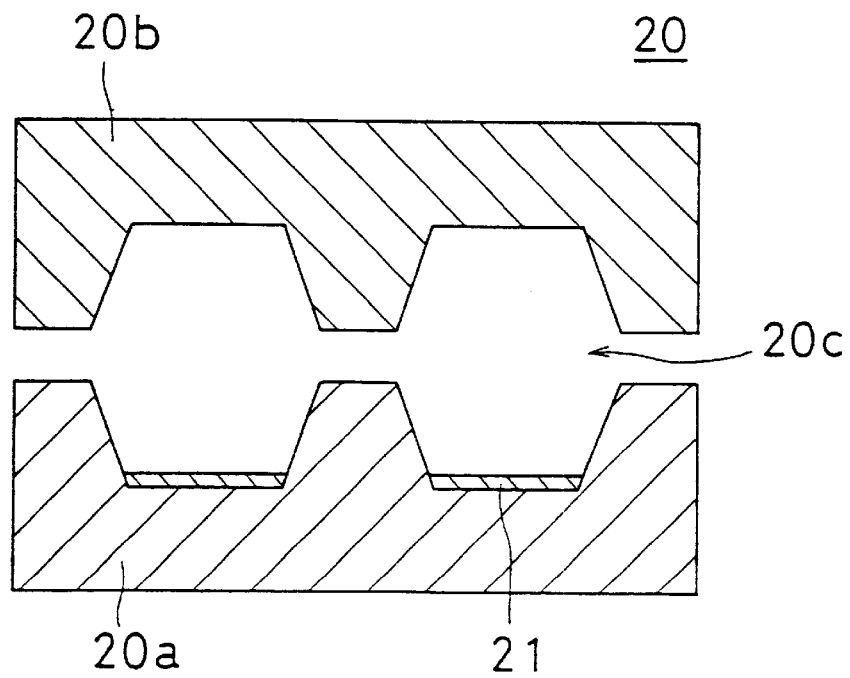
FIG. 6 is a sectional view showing in simplified fashion a configuration of a molding die 20 used according to a second embodiment of the invention.

FIG. 6 shows a configuration of a molding die 20 used for a second embodiment of the invention. The mark surface die 20a of the molding die 20 according to this embodiment is formed with a photosensitive resin masks 21a, 21b of FIGS. 7A, 7B, and a resin mold package is formed in the cavity 20c formed between the mark surface die 20a and the back die 20b.

Figure 7A:
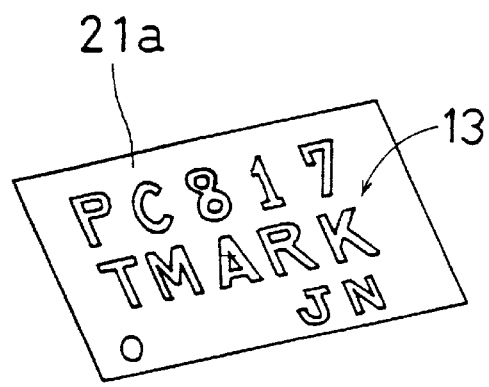
FIGS. 7A and 7B are perspective views showing in simplified fashion a photosensitive resin mask 21 used for the molding die 20 of FIG. 6.
Figure 7B:
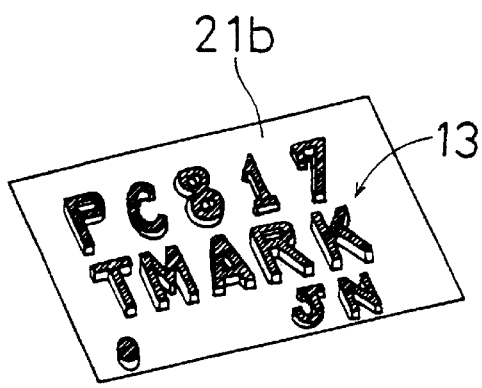

In the photosensitive resin masks 21a, 21b as shown in FIGS. 7A, 7B, a photosensitive resin yet to be cured is mounted by coating or the like means on the mark surface die 20a and ultraviolet light or laser light is radiated to cure a part corresponding to the contents of marking 13 while the uncured portion is removed with a solvent or the like. FIG. 7A shows a recessed type mask 21a for forming the protruded marks 15a as shown in FIG. 5A. FIG. 7B shows a protruded type mask 21b for forming the recessed marks 15b as shown in FIG. 5B. At the time of changing the contents of marking, the photosensitive resin masks 21a, 21b are removed by a resin or a sheet containing a solvent of a photosensitive resin, and a photosensitive resin is newly coated to form protrusions and recesses corresponding to the contents of marking 13. In this way, the contents of marking can be changed. According to this embodiment, the masks 21a, 21b can be mounted or removed substantially without changing the conventional molding die.

Figure 8:
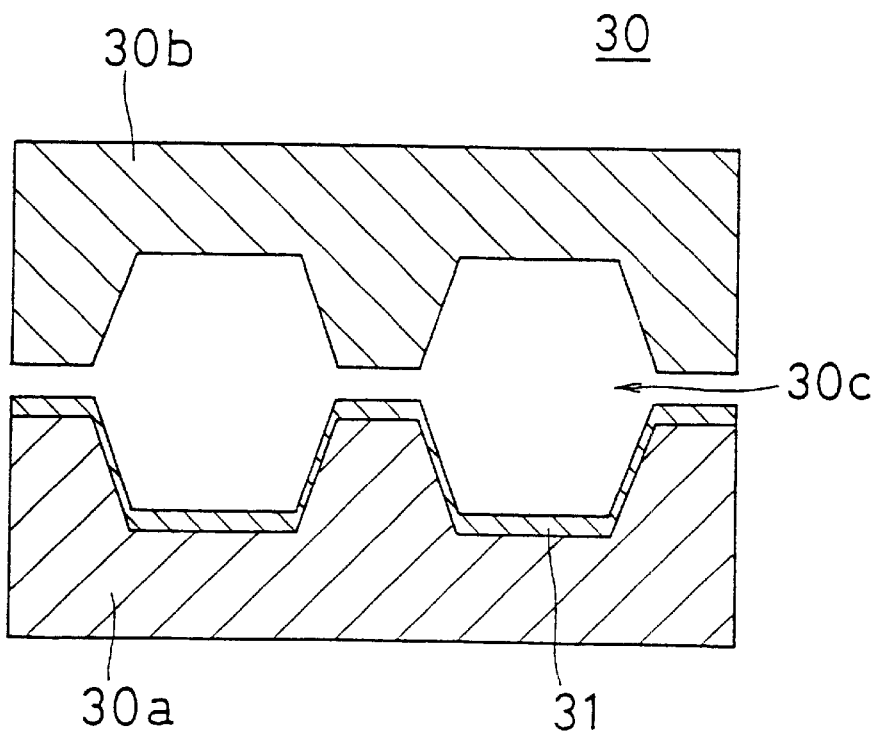
FIG. 8 is a sectional view showing in simplified fashion a configuration of a molding die 30 used according to a third embodiment of the invention.

FIG. 8 shows a general configuration of a molding die 30 according to a third embodiment of the invention. A marking sheet 31 is mounted over the entire mask surface die 30a of the molding die 30 according to this embodiment. A resin mold package is molded in a cavity 30c between a back die 30b and the mark surface die 30a with the marking sheet 31 mounted over the entire surface thereof, and the contents of marking formed on the surface of the marking sheet 31 are transferred to the surface of the resin mold package to be molded, thus making it possible to perform the molding and the marking at the same time.

Figure 9:
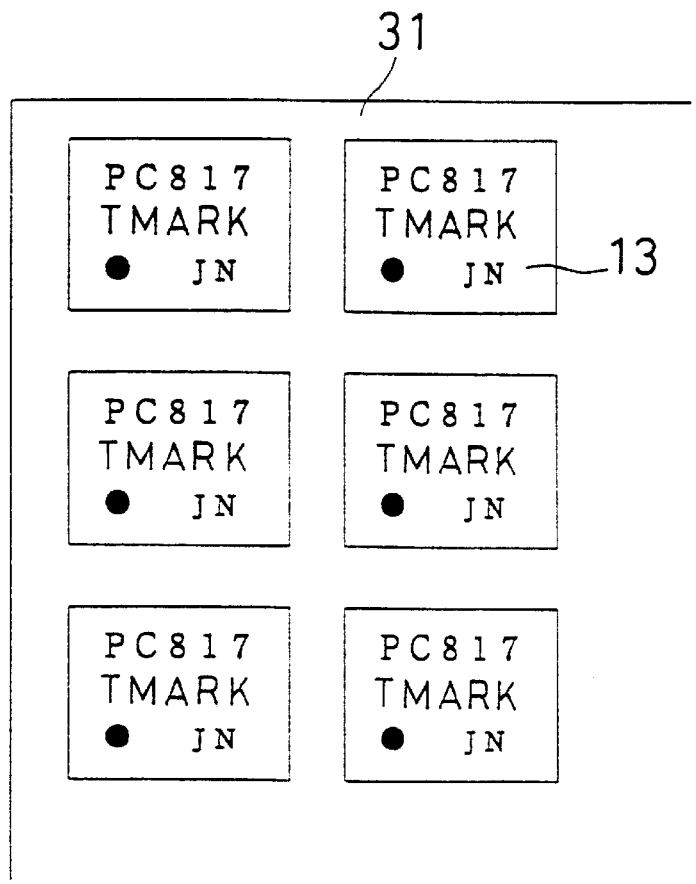
FIG. 9 is a partial plan view of a marking sheet 31 used for the molding die 30 of FIG. 8.

FIG. 9 shows the marking sheet 30 of FIG. 8 on the surface of which a plurality of contents of marking 13 are formed and held. The contents of marking 13 are arranged in accordance with the pitches of the cavities of the molding die 30, thereby making possible simultaneous setting of masks for a plurality of cavities. According to this embodiment, the contents of marking can be changed simply by changing the marking sheet 31. Thus, the molding die 30 can be prevented from being fouled by the markings.

Figure 10A:
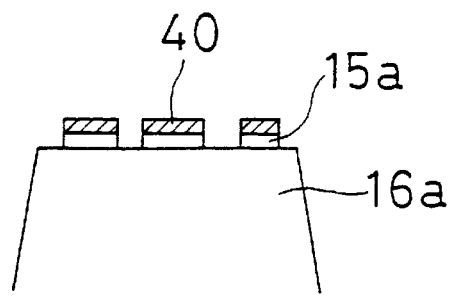
FIGS. 10A and 10B are partial sectional views showing a state of marking according to a fourth embodiment of the invention.
Figure 10B:
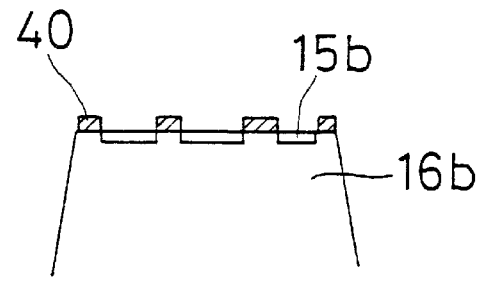

FIGS. 10A and 10B show a fourth embodiment of the invention in which the mark visibility is improved by stamp ink 40. FIG. 10A shows the state in which the stamp ink 40 is applied on the protruded marks 15a on the surface of the package of the light-coupled element 16a shown in FIG. 5A, for example, and FIG. 10B shows the state in which the stamp ink 40 is applied on other parts than the recessed marks 15b on the surface of the package of the light-coupled element 16b of FIG. 5B. The stamp ink 40 contains as main components thereof the thermosetting resin or the ultraviolet light-setting resin having the color of white, silver, etc. superior in visibility in contrast with the package. Once the stamp ink 40 is cured after being applied with a simple process, the visibility of the marking can be improved. The stamp ink 40 is applied for the sole purpose of improving the visibility of the contents of marking 13 formed as protrusions and recesses on the package surface, and therefore can be applied more easily than the marking.

Figure 11:
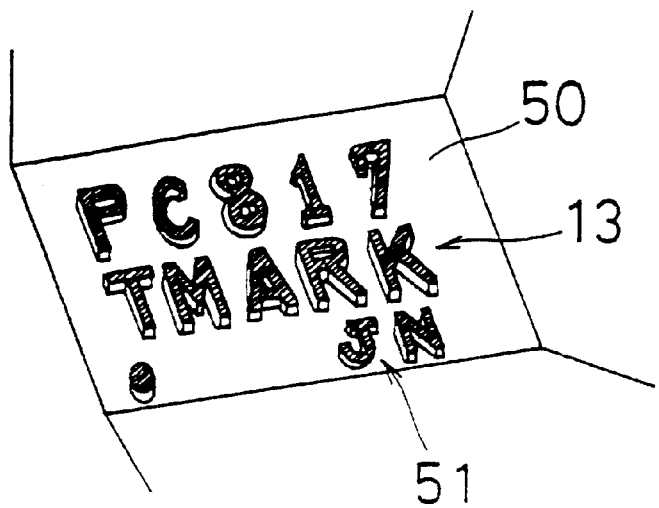
FIG. 11 is a partial perspective view showing a molding die 50 used according to a fifth embodiment of the invention.

FIG. 11 shows a fifth embodiment of the invention in which the contents of marking 13 are added by stamping with stamp ink 51 on the surface of a molding die 50. When a resin mold package is formed using this molding die 50, the stamp ink 51 indicating the contents of marking is coupled to the surface of the resin mold package. Thus, the marking can be accomplished at the same time as the molding, and therefore the subsequent marking process which otherwise might be required can be eliminated. The contents of marking can be easily changed simply by changing the stamping mask.

Figure 12:
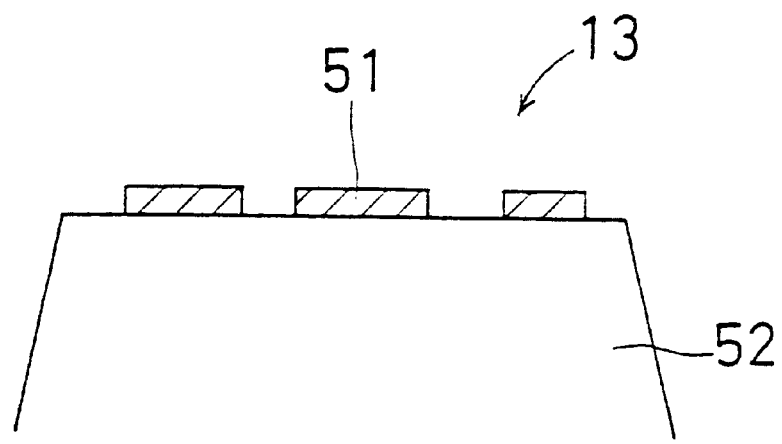
FIG. 12 is a partial sectional view showing a mark on the mold package molded according to the embodiment of FIG. 11.
Figure 13:
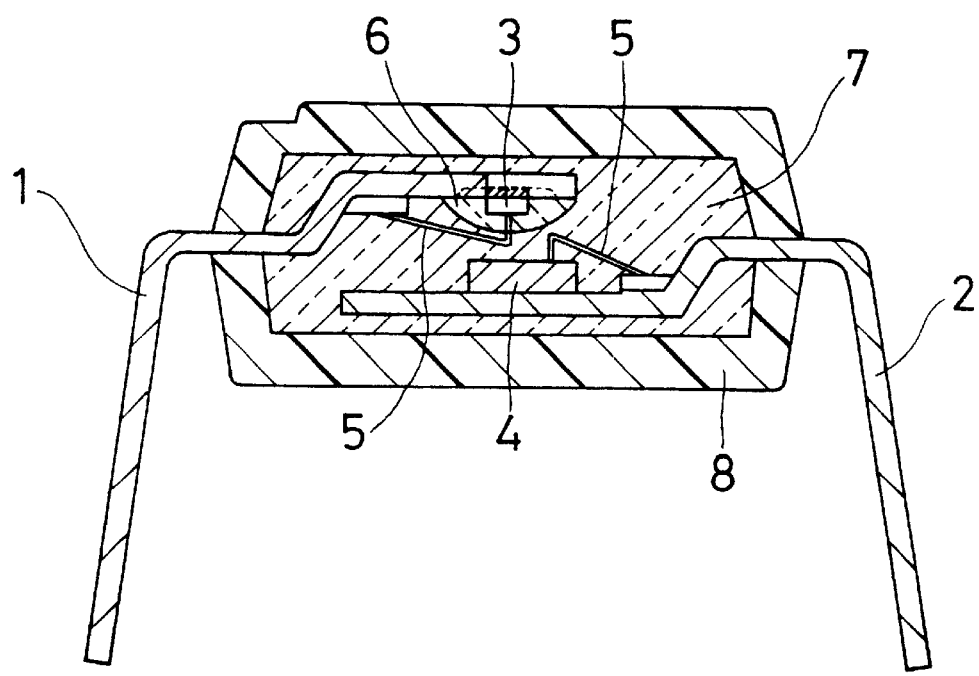
FIG. 13 is a sectional view showing in simplified fashion the structure of a conventional light-coupled element.

FIG. 12 shows the state in which the contents of marking 13 of the stamp ink 51 of FIG. 11 are coupled to the surface of a mold package 52 according to this embodiment. The stamp ink 51 is made of an ultraviolet light-setting resin or a thermosetting resin, and once coupled to the surface of the mold package 52, can realize a display having a durability at least equal to the marks added in a separate process.

In each of the embodiments described above, marking of the resin mold package of a light-coupled element is carried out simultaneously with the process of molding the resin mold package. Marking of the resin mold package of an ordinary semiconductor device can also be carried out simultaneously with the molding process according to the invention. In the case of a light-coupled element, the molding is divided into primary and secondary molding processes. Unless the primary molding with a light-transmitting resin is required, however, the molding can be accomplished in a single process simultaneously with marking.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A multi-part molding die defining a closable cavity for simultaneously sealingly molding a semiconductor element in a package of a preselected size and shape and creating a marking having a predetermined content on a surface of the package, said molding die comprising:

at least two integrally formed members, each said member defining inner walls forming an open-topped cavity portion of said closable cavity, and said closable cavity being sized to accommodate the semiconductor element within said preselected shaped package and adapted to receive a quantity of synthetic resin encapsulating the semiconductor element;

a mask including means for forming a distinctive pattern representative of said content of said marking to be created on said surface of said package; and a single-piece jig adapted for releaseably holding said mask;

wherein one of said members and said jig are adapted to mechanically interact directly with one another so as to removably retain said jig immediately outwardly adjacent to portions of said preselected package shape defined by said one of said members while said jig releaseably holds said mask at a predetermined position immediately inwardly adjacent to the preselected package shape defined by said one of said members.

2. The molding die of claim 1, wherein said mask comprises protrusions and/or recesses three-dimensionally representatively forming said content of said marking to be created on said surface of said package.

3. A method for simultaneously molding and marking semiconductor device containing packages, said method comprising the steps of:

(i) providing a multi-part molding die defining a closable cavity for simultaneously sealingly molding a semiconductor element in a package of a preselected size and shape and creating a marking having a predetermined content on a surface of the package, said molding die comprising: at least two integrally formed members, each said member defining inner walls forming an open-topped cavity portion of said closable cavity, and said closable cavity being sized to accommodate the semiconductor element within said preselected shaped package and adapted to receive a quantity of synthetic resin encapsulating the semiconductor element; a mask including means for forming a distinctive pattern representative of said content of said marking to be created on said surface of said package; and a single-piece jig adapted for releaseably holding said mask; wherein one of said members and said jig are adapted to mechanically interact directly with one another so as to removably retain said jig immediately outwardly adjacent to portions of said preselected package shape defined by said one of said members while said jig releaseably holds said mask at a predetermined position immediately inwardly adjacent to the preselected package shape defined by said one of said members;

(ii) locating said mask in said jig and locating said mask containing jig in one of said members in said predetermined position;

(iii) closing said mold cavity; and (iv) filling said closed mold cavity with a synthetic resin so as to form a molded package encapsulating said semiconductor element and create said marking on a surface of said package in accordance with said predetermined content of said marking representatively defined by said mask.

4. The method for simultaneously molding and marking packages of claim 3, wherein said mask comprises protrusions and/or recesses three-dimensionally representatively defining said content to be created by said marking on said package.

5. The method for simultaneously molding and marking of claim 4, wherein after said package has been molded and marked, the marking on said package is stamped with ink to improve the visibility of the contents of the marking.

6. A method for simultaneously molding and marking semiconductor device containing packages, said method comprising the steps of:

(i) providing a multi-part molding die defining a closable cavity for simultaneously sealingly molding a semiconductor element in a package having a preselected shape and creating a marking having a predetermined content on a surface of the package, said molding die comprising: at least two integrally formed members, each said member defining inner walls forming an open-topped cavity portion of said closable cavity, and said closable cavity being sized to accommodate the semiconductor element within said preselected shaped package and adapted to receive a quantity of synthetic resin encapsulating the semiconductor element; a mask including a distinctive pattern representative of said content of said marking to be created on said surface of said package; wherein said one of said members and said mask are adapted to mechanically interact directly with one another so as to removably retain said mask at a predetermined position immediately inwardly adjacent to the portion of the predetermined package shape defined by said one of said members;

(ii) locating said mask in said molding die in said predetermined position;

(iii) closing said mold cavity; and (iv) filling said closed mold cavity with a synthetic resin so as to form a molded package encapsulating said semiconductor element and create said marking on a surface of said package in accordance with said predetermined content of said marking representatively defined by said mask.

7. The method for simultaneously molding and marking of claim 6, wherein said mask comprises a photosensitive resin.

8. The method for simultaneously molding and marking of claim 6, wherein said mask comprises a sheet releaseably carrying a marking material in a pattern representative of the content of said marking, and said marking material is adapted for transfer from said sheet into a surface of said package during molding.

9. The method for simultaneously molding and marking of any one of claims 6–8, wherein after said package has been molded and marked, the marking on said package is stamped with ink to improve the visibility of the contents of the marking.

10. A method for simultaneously molding and marking semiconductor device containing packages, said method comprising the steps of:

(i) providing a multi-part molding die defining a closable cavity for simultaneously sealingly molding a semiconductor element in a package and creating a marking having a predetermined content on a surface of the package, said molding die comprising at least two integrally formed members, each said member defining inner walls forming an open-topped cavity portion of said closable cavity and at least one of said members including at least a section adapted to directly receive and releaseably hold a pigment containing material in a pattern representative of said predetermined content, and said closable cavity being sized to accommodate the semiconductor element to be packaged and adapted to receive a quantity of synthetic resin encapsulating the semiconductor element;

(ii) directly applying said pigment containing material to said at least a section in a pattern representative of said predetermined content;

(iii) closing said mold cavity; and (iv) filling said closed mold cavity with a synthetic resin so as to form a molded package encapsulating said semiconductor element and to transfer said pigment containing material into a surface of said package in accordance with said predetermined content of said marking.

11. The method for simultaneously molding and marking of claim 10, wherein said pigment containing material is a transferable ink, and step (ii) comprises stamping said transferable ink directly onto said at least a section of said open-topped cavity.

12. A method for simultaneously molding and marking semiconductor device containing packages, said method comprising the steps of:

(i) providing a multi-part molding die defining a closable cavity for simultaneously sealingly molding a semiconductor element in a package of a preselected shape and creating a marking having a predetermined content on a surface of the package, said molding die comprising: at least two integrally formed members, each said member defining inner walls forming an open-topped cavity portion of said closable cavity and at least one of said members including a pattern defining element directly mechanically associated with at least an inwardly facing section of said preselected shape defined thereby, said pattern defining element being adapted to removably receive and carry a pattern representative of said predetermined content, and said closable cavity being sized to accommodate the semiconductor element within said preselected shaped package and adapted to receive a quantity of synthetic resin encapsulating the semiconductor element;

(ii) directly mechanically associating said pattern defining element with said at least a section of said at least one of said members;

(iii) closing said mold cavity; and (iv) filling said closed mold cavity with a synthetic resin so as to form a molded package encapsulating said semiconductor element and to transfer said marking content into a surface of said package.

13. A method for simultaneously molding and marking semiconductor device containing packages according to claim 12, wherein said pattern defining element comprises a mask including means for forming a distinctive pattern representative of said content of said marking to be created on said surface of said package; and a single-piece jig adapted for releaseably holding said mask; and wherein said pattern defining element is associated with said at least one member by adapting said inner walls of said at least one of said members and said jig to mechanically interact directly with one another so as to removably retain said jig immediately outwardly of said cavity portion while said jig releaseably holds said mask at a predetermined position immediately inwardly adjacent to said inner walls of said at least one of said members.

14. A method for simultaneously molding and marking semiconductor device containing packages according to claim 12, wherein said pattern defining element comprises a mask including a distinctive pattern representative of said content of said marking to be created on said surface of said package; and wherein said inner walls of said at least one of said members and said mask are adapted to mechanically interact directly with one another so as to removably retain said mask at a predetermined position in said cavity.

15. The method for simultaneously molding and marking packages of any of claims 12, 13 or 14, wherein said mask comprises protrusions and/or recesses three-dimensionally representatively defining said content to be created by said marking on said package.

16. The method for simultaneously molding and marking of claims 12, 13, or 14, wherein after said package has been molded and marked, the marking on said package is stamped with ink to improve the visibility of the contents of the marking.

17. A method for simultaneously molding and marking semiconductor device containing packages according to claim 12, wherein said pattern defining element comprises a mask including a distinctive pattern representative of said content of said marking to be created on said surface of said package;

wherein said mask comprises protrusions and/or recesses three-dimensionally representatively defining said content to be created by said marking on said package; and wherein said protrusions and/or recesses are formed by stamping a transferable marking material onto said section of said at least one member.

* * * * *